United States Patent
Halpern

[11] Patent Number: 5,571,332
[45] Date of Patent: Nov. 5, 1996

[54] ELECTRON JET VAPOR DEPOSITION SYSTEM

[75] Inventor: Bret Halpern, Bethany, Conn.

[73] Assignee: Jet Process Corporation, New Haven, Conn.

[21] Appl. No.: 386,705

[22] Filed: Feb. 10, 1995

[51] Int. Cl.⁶ .................................................. C23C 16/00
[52] U.S. Cl. ........................... 118/723 HC; 118/732 MP; 118/730; 204/298.05; 427/250; 427/446; 427/449; 315/111.81; 315/111.91
[58] Field of Search ...................... 118/723 HE, 723 DC, 118/723 MP, 730; 204/298.01, 298.04, 298.05; 427/248.1, 250, 446, 449; 315/111.21, 111.81, 111.91

[56] References Cited

U.S. PATENT DOCUMENTS

| | | | |
|---|---|---|---|
| 2,155,932 | 4/1938 | Davis | 41/42 |
| 3,382,845 | 5/1968 | Jester | 118/610 |
| 3,654,895 | 4/1972 | Bloom et al. | 118/48 |
| 3,808,035 | 4/1974 | Stelter | 117/106 |
| 3,840,391 | 10/1974 | Stelter | 117/106 |
| 3,850,679 | 11/1974 | Sopko et al. | 117/106 |
| 4,033,286 | 7/1977 | Chern et al. | 118/49 |
| 4,147,573 | 4/1979 | Morimoto | 148/175 |
| 4,351,267 | 9/1982 | Kalbskopf et al. | 118/718 |
| 4,377,564 | 3/1983 | Dahlberg . | |
| 4,424,104 | 1/1984 | Harper | 204/192 N |
| 4,468,283 | 8/1984 | Ahmed | 156/345 |
| 4,689,093 | 8/1987 | Ishihara et al. | 437/5 |
| 4,788,082 | 11/1988 | Schmitt . | |
| 4,851,254 | 7/1989 | Yamamoto et al. | 427/37 |
| 4,871,580 | 10/1989 | Schram et al. . | |
| 4,890,575 | 1/1990 | Ito | 118/723 |
| 4,909,914 | 3/1990 | Chiba et al. . | |
| 4,911,805 | 3/1990 | Ando et al. . | |
| 4,957,061 | 9/1990 | Ando et al. . | |
| 4,957,062 | 9/1990 | Schuurmans et al. . | |
| 4,970,091 | 11/1990 | Buhrmaster et al. | 427/34 |

(List continued on next page.)

FOREIGN PATENT DOCUMENTS

| | | |
|---|---|---|
| 0286306 | 10/1988 | European Pat. Off. . |
| 47-012925 | 4/1972 | Japan . |
| 62-158195 | 7/1987 | Japan . |
| 63-028874 | 2/1988 | Japan . |
| 64-033096 | 2/1989 | Japan . |
| 1-100275 | 4/1989 | Japan . |
| 1-179789 | 7/1989 | Japan . |
| 1-292828 | 11/1989 | Japan . |
| 2-026895 | 1/1990 | Japan . |
| 263789 | 10/1990 | Japan ........................ 118/723 HC |
| 279592 | 11/1990 | Japan ........................ 118/723 HC |
| 899275 | 6/1992 | United Kingdom . |

OTHER PUBLICATIONS

J. J. Cumo, J. M. E. Harper, Technology and Applications of Broad–Beam Ion Sources Used In Sputtering, J. Vac. Sci. Technology, 725–727 Sep. 1982.

Rointan F. Bunshah, Handbook of Deposition Technologies for Films and Coatings, Second Edition, Chapter 5, pp. 249, 279–727 1994.

Rointan F. Bunshah, Handbook of Deposition Technologies for Films and Coatings, Second Edition, Chapter 6, pp. 320–321, 325, 330, 331 1994.

(List continued on next page.)

Primary Examiner—Robert Kunemund
Assistant Examiner—Jeffrie R. Lund
Attorney, Agent, or Firm—McCormick, Paulding & Huber

[57] ABSTRACT

A gas jet film deposition system includes a source of thermionically emitted electrons which are accelerated through carrier gas and generate He ions by impact ionization. The resultant electron avalanching and multiplication generates an extremely dense plasma, and produces large electron currents. The electron current is collected at a free, high electric field end of a crucible. The present system can generate vaporized evaporant which is entrained in the gas jet and thereby provide a high density source of ions. The ions may be presented to a substrate together with or without the evaporant.

10 Claims, 5 Drawing Sheets

U.S. PATENT DOCUMENTS

| | | | |
|---|---|---|---|
| 4,974,544 | 12/1990 | Ohta | 118/723 |
| 4,982,067 | 1/1991 | Marantz et al. | |
| 4,987,002 | 1/1991 | Sakamoto et al. | |
| 4,989,541 | 2/1991 | Mikoshiba | 118/723 |
| 5,000,114 | 3/1991 | Yanagi et al. | |
| 5,104,634 | 4/1992 | Calcote | |
| 5,256,205 | 10/1993 | Schmitt, III et al. | |
| 5,356,672 | 10/1994 | Schmitt, III et al. | |
| 5,356,673 | 10/1994 | Schmitt et al. | |
| 5,378,285 | 1/1995 | Mitani | 118/723 HC |

OTHER PUBLICATIONS

H. Kogelnik and C. V. Shank, Applied Physics Lett., 18, 152 (1971).

H. P. Weber and R. Ulrich, Applied Physics Lett., 19 38 (1971).

I. P. Kaminow, L. W. Stulz, E. A. Chandros, and C. A. Pryde Applied Optics 11 1563 (1972).

R. L. Fork and Z. Kaplan Appl. Phys. Letters 20 472 (1972).

K. H. Drexhage in "Dye Lasers", F. P. Schaefer, ed., Springer-Verlag, 1973, chapter 4 Chapter Summary.

D. Avnir, V. R. Kaufman, and R. Reisfeld, J. Non-Crystalline Solids 74 395 (1985).

D. Levy and D. Avnir, Unconventional Photoactive Solids 2nd Int. Conf. Photoact.Solids, Cleveland, OH, 1989; H. Scher, editor; p. 193.

J. D. Mackenzie in Ultrastructure Processing of Ceramics, Glasses and Composites, L. L. Hench and D. R. Ulrich, eds., Wiley –Interscience, 1984, chapter 3.

D. Lo, J. E. Parris, and J. L. Lawless Applied Physics B 55, 365 (1992).

High-Quality MNS Capacitors Prepared By Jet Vapor Deposition at Room Temperature by D. Wang, T. P. Ma, J. W. Golz, B. L. Halpern and J. S. Schmitt from IEEE Electron Device Letters, vol. 13, No. 9, Sep. 1992, pp. 482–483.

Enhancing Semiconductor Reactions by Nuccio and Schiavone from IBM Technical Disclosure Bulletin, vol. 12, No. 9, Feb. 1970, pp. 1433–1434.

Synthesis of Diamond Films in a RF Induction Thermal Plasma by S. Matsumoto, M. Hino & T. Kobayashi from Appl. Phys. Lett., vol. 51, No. 10, 7 Sep. 1987, pp. 737–739.

Diamond and Diamond–Like Materials Synthesis by G. H. Johnson, A. R. Badzian, M. W. Geis from Materials Research Society, Apr. 5–9, 1983, pp. 95–98.

Quantum Size Effects in Ge Microcrystals Embedded in $SiO_2$ Thin Films by Shinji Hayashi, Minoru Fujii and Keiichi Yamamoto, Jun. 21, 1989.

CDS Particle Polymer Films For Nonlinear Optics by Y. Ohashi, H. Ito, T. Hayashi, A. Nitta, H. Matsuda, S. Okada, H. Nakanishi and M. Kato, from Phys., vol. 36, 1989, pp. 81–84.

Properties of Metal Clusters in Polymerized Hydrocarbon Versus Fluorocarbon Matrices by C. Laurent and E. Kay, J. Appl. Phys. 65, Feb. 15, 1989, pp. 1717–1723.

Research Opportunities On Clusters and Cluster–Assembled Materials by R. P. Andres, R. S. Averback, W. L. Brown, L. E. Brus, W. A. Goddard, III, A. Kaldor, S. G. Louie, M. Moscovits, P. S. Peercy, S. J. Riley, R. W. Siegel, F. Spaepan, Y. Wang from J. Mater. Res., vol. 4, No. 3, May/Jun. 1989.

Production of Thin Films by Controlled Disposition of Sputtered Materials by E. D. McClanahan and N. Laegreid excerpt from Chapter 7 of Sputtering by Particle Bombardment III, Topics in Applied Physics, vol. 64 Springer–Verlag, 1991.

Microstructure Analysis of Thin Films Deposited by Reactive Evaporation and by Reactive Ion Plating by Karl–Heinz Muller, Jan. 16, 1989.

Theoretical and Experimental Study of The Duoplasmatron Ion Source Part I by C. Lejeune from Nuclear Instruments and Methods, 116 (1974).

Ion Plating by Donald M. Mattox from Chapter 6 in R. F. Bunshah.

Microfabrication by Sputtering by K. Wasa and S. Hayakawa from Chapter 6 of Handbook of Sputter Deposition Technology, 1992, Noyes Publishing Co., Park Ridge, New Jersey, pp. 275–277.

Sputter Deposition Process by J. A. Thornton and J. E. Greene from Chapter 5 of Handbook of Deposition Technologies for Films and Coatings, 2nd Edition, Noyes Publications, Park Ridge, New Jersey.

Fast Flow Deposition of Metal Atoms On Liquid Surfaces: Gold Sol Formation and Surface Lifetime by Bret L. Halpern, Journal of Colloid and Interface Science, vol. 86, No. 2, 1982, pp. 337–343.

Internal Impaction of Heavy Molecules by J. Fernandez De La Mora, Bret L. Halpern and J. A. Wilson, J. Fluid Mech., vol. 149, 1984, pp. 217–233.

ELECTRON JET VAPOR DEPOSITION SYSTEM

CROSS REFERENCE TO RELATED APPLICATIONS

Some of the subject matter herein is disclosed and claimed in the following U.S. patents and patent applications each of which is incorporated herein by reference:

| U.S. Pat. No. | Inventor |
| --- | --- |
| 4,788,082 | J. J. Schmitt |
| 5,256,205 | J. J. Schmitt and B. L. Halpern |
| 5,356,673 | J. J. Schmitt and B. L. Halpern |
| U.S. Pat. application | |
| 08/212,016 | Bret Halpern |
| 08/212,023 | Jian-Zhi Zhang |

FIELD OF INVENTION

The present invention relates to systems for thin film deposition of metals and compounds of metals. In particular, it is directed to a new kind of deposition system incorporating an "electron jet" Jet Vapor Deposition (JVD) source. The present system is operable in low vacuum, and has the special advantages of high deposition rate, the ability to vaporize all metals, versatility, and control of crystallinity via ion bombardment at low energy and high flux.

BACKGROUND OF THE INVENTION

The technological importance of thin films has led to a multitude of deposition methods whose diversity can be seen by way of reference to many textbooks, including "Handbook of Deposition Technologies for Films and Coatings" by R. Bunshah published by Noyes Publishing Co. Park Ridge N.J. (1994). There is an ever growing need to develop innovative and economical techniques for manufacture of complex materials having controlled properties. A family of vapor deposition processes have been developed by the assignee of the present invention and are referred to with the trademark Jet Vapor Deposition (JVD). The JVD processes have shown advantages over established methods derived, in part, from the unique "low vacuum" operating regime and from the novel vapor sources that exploit that regime.

Vapor deposition methods are divided traditionally into Chemical Vapor Deposition (CVD) and Physical Vapor Deposition (PVD), according to the means of generating film components. In CVD, precursor molecules react at the substrate, usually at elevated temperature and pressure, to yield film components. In PVD, film components are generated some distance from the substrate, usually in high vacuum; the gas phase mean free path is large, and film species travel "line of sight" to the growing film. A JVD process, however, does not fit this traditional description.

In a JVD process, film components are generated remotely, as in PVD, but the vacuum is "low", and the mean free path small. Film components travel "line of sight", but not through collision free space. Instead, the film components are convected to the substrate in a collimated, sonic, inert gas "jet in low vacuum". Exemplary processes set forth in the aforementioned patents include one based on microwave discharge chemistry which is capable of depositing metals and other materials such as silicon (Si). A second process uses a "wirefeed/hot filament" and is useful for depositing at extremely high rates copper (Cu), gold (Au), and silver (Ag), and, with some constraints, low melting metals aluminum (Al), zinc (Zn), tin (Sn), antimony (Sb), indium (In), and cadmium (Cd).

Sources of metal vapor are known in the art. For example, electron beam vaporization is capable of ultra-high metal throughputs, but the efficiency of power usage is low, X-rays must be considered, and expensive high vacuum apparatus is normally needed. Laser ablation in principle can give high rates, but the lasers required are bulky and expensive. In other systems, metal-organic chemistry can be used for metal atom generation, but the gaseous precursors are toxic and expensive, and require careful gas handling.

Known systems are limited in the metals which can be vaporized or in the deposition rates which can be achieved. It would be advantageous to have a system that offers a combination of two important and sought-after features: high rate deposition, and film property control. The present invention is drawn towards such a system. A system provided in accordance with the present invention can vaporize virtually any metal at high rate. It also represents a breakthrough in the control of microstructure in a growing film as the substrate can be bombarded with ions at controllably low energy and extreme high flux.

SUMMARY OF INVENTION

An object of the present invention is to provide a gas jet vapor deposition system that is usable with a very broad range of metals.

Another object of the present invention is to provide a gas jet vapor deposition system of the foregoing type that vaporizes metal at high rates.

Still another object of the present invention is to provide a gas jet vapor deposition system of the foregoing type that provides a high concentration of gas phase ions for high flux ion bombardment of growing films with low energy ions.

Still another object of the present invention is to provide a gas jet vapor deposition system of the foregoing type that is compatible with JVD processes which coating of large areas via jet-substrate relative motion.

Yet another object of the present invention is to provide a gas jet vapor deposition system of the foregoing type that is compatible with JVD moving substrate processes thereby enabling alloy, multilayer, and multicomponent film deposition in combination.

According to the present invention, a gas jet system for vapor deposition of a film upon a substrate includes a vacuum chamber having a port allowing for access to a vacuum chamber interior. There is an apparatus for locating the substrate within the vacuum chamber interior at a substrate position. A gas jet apparatus is affixed to the vacuum chamber port and is for depositing material on the substrate by providing controlled entry of reactant gas into the interior of the vacuum chamber. The gas jet apparatus includes a nozzle having an interior cavity which provides, from a nozzle tip, a supersonic jet of gas directly towards the substrate position. There is an apparatus for providing carrier gas within said nozzle interior cavity and an apparatus for providing the reactant gas within the nozzle interior cavity. A cathode means provides electrons to the nozzle interior cavity. There is a circuit for providing an electrical potential between the cathode and an anode. The system also includes a pump for evacuating gas from the vacuum chamber to maintain a pressure therein. Further objects and

DESCRIPTION OF THE PREFERRED EMBODIMENT

Figure 1:
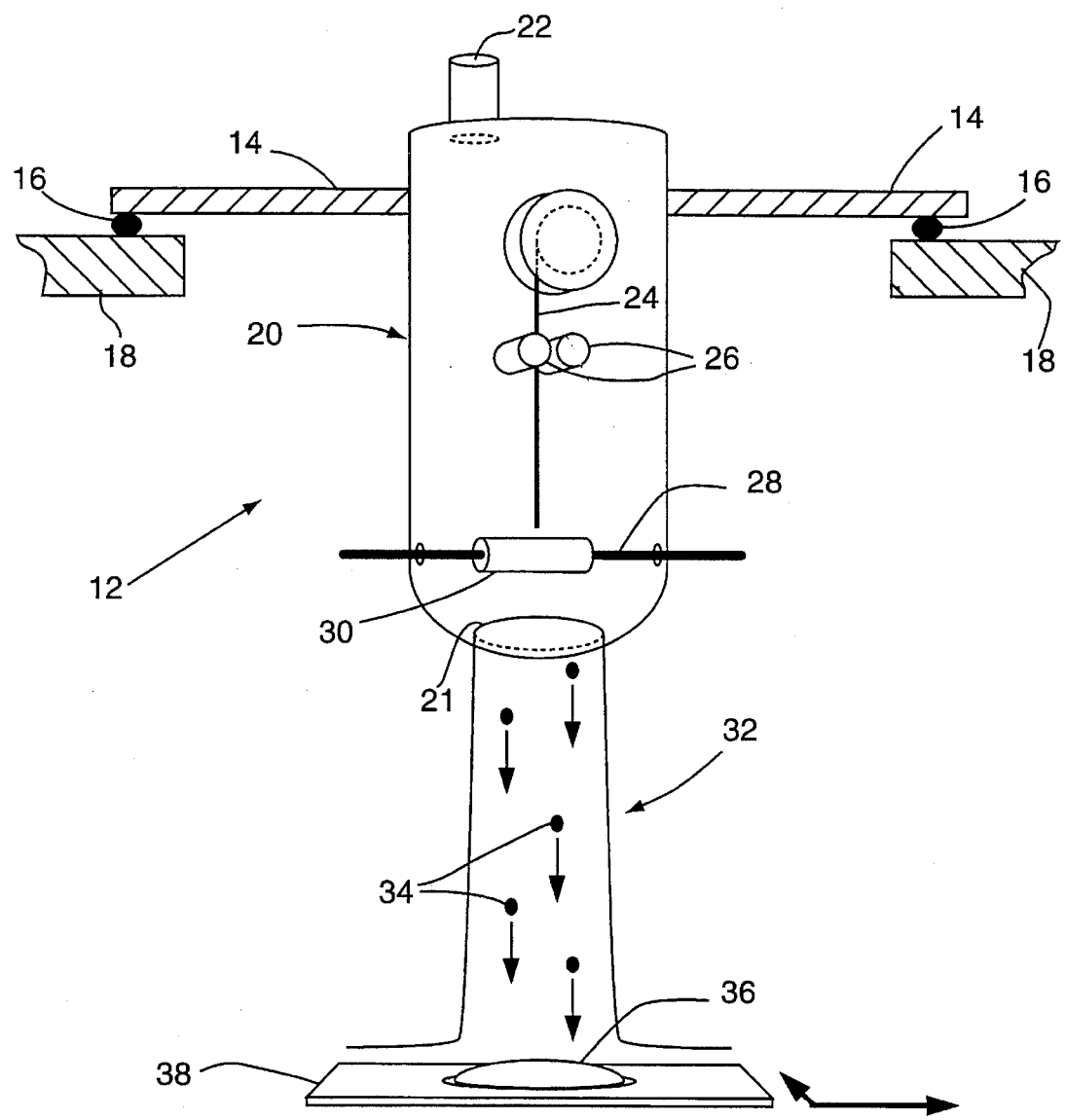
FIG. 1 is a simplified schematic illustration of a side view of a portion of a known jet deposition system with several components shown in perspective.

The principles of a JVD process are illustrated schematically in the operation of a wirefeed/hot filament jet system 12 of FIG. 1 which is disclosed and claimed in at least one of the above referenced patents or patent applications. The jet system 12 includes a flange 14 which is equipped with an O-ring 16 to provide a vacuum seal, and then bolted to the wall of a deposition chamber 18. The deposition chamber is constructed of aluminum, stainless steel, and glass, in cylindrical and cubic form; other materials and shapes are possible.

The jet system 12 can provide, for example, a flux of gold (Au) atoms by means of a gas jet apparatus 20 having an exit nozzle 21 with a large exit diameter on the order of several millimeters to 2 cm. Those skilled in the art will note that elements are equivalently referred to by their respective scientific names. Helium or other inert carrier gas is supplied through inlet 22 and incorporated in a fast flow, low pressure system, whose steady state flow and pressure are sustained by mechanical pumps with speeds ranging from 400 to 20,000 liters/minute. Nozzle pressures $P_n$ are in typically in the range of 1 to 10 torr, and downstream pressures $P_d$ are between 0.1 and 1 torr, but there is considerable latitude in both ranges. For $P_n/P_d > 2$, "critical" flow is obtained; the jet emerges at the speed of sound, ~$10^5$ cm/sec for He.

Gold atoms are vaporized from a hot tungsten filament 28 located near the nozzle exit where the helium carrier is accelerated to near sonic speeds. There is a sheath 30 protecting the filament. In the source, a wire of Au, for example, (or Ag, Cu, Al) is guided to the filament via a wirefeed mechanism consisting of rubber or knurled steel wheels 26 moves evaporant wire 24 through a hypodermic guide tube (not shown) aimed at the filament, with the feed rate determined by computer controlled stepper motors, also not shown. This system permits continuous vaporization. As the gold wire contacts the hot filament, it melts, wets the filament, and vaporizes. Evaporated Au atoms are swept by the gas 32 jet out of the nozzle to a substrate 38 downstream. Entrained Au atoms 34 are deposited in a well defined circular zone of about the jet diameter to comprise film 36.

Figure 2:
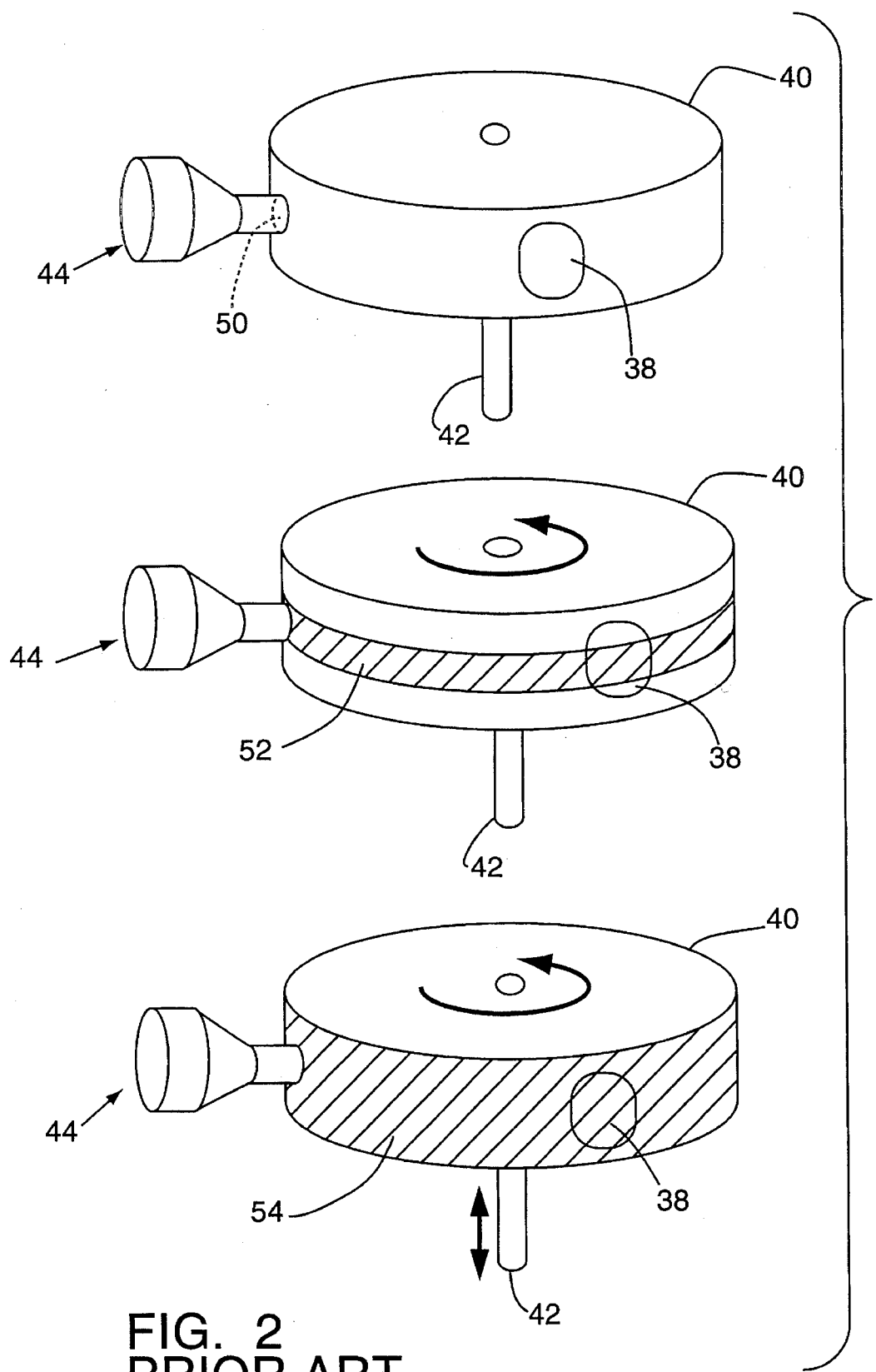
FIG. 2 is a simplified schematic illustration of a portion of another known jet deposition system with a perspective drawing of a movable substrate carousel.

One or more substrates can either be held stationary, as shown in FIG. 1, or mounted on a "carousel" 40 which both spins around and oscillates along its own axis 42, under computer control, as shown in FIG. 2. One or more jet apparatus 44 can be aimed at the carousel. If the substrate is stationary, atoms deposit in a mirror-bright circular film 50. If the carousel is spinning only, material deposits in an annulus 52; if it oscillates along its axis as well, its entire surface is efficiently coated with a uniformly thick layer 54. In this way, even though the stationary deposit is thicker at its center, large areas (~1000 cm$^2$) are coated uniformly, and the carousel approach is used routinely for large scale, batch production.

The many advantages of a jet vapor deposition system arise in large measure from the pressure range of jet operation: ~1–10 torr in the nozzle, and ~0.1–1 torr downstream. At these pressures the jet is collimated and nearly cylindrical so that deposition is localized and efficient. "Line of sight" deposition is obtained as in high vacuum, but at higher throughput, and with no vapor wasted traveling in "wrong" directions. Because of the high thermal conductivity of metals, the contact of evaporant wire with a hot filament is an extremely efficient way to vaporize that wire. Moreover, evaporant wire can be fed rapidly, and even small lengths of vaporized wire correspond to substantial film thickness and area.

Jet apparatus can be used singly or in combination. With one or more jet apparatus "scan" fast moving substrates, a jet vapor deposition system opens a powerful route to reactive synthesis of a host of films, controllable at submonolayer level but deposited at high rate. The end products can be alloys, multicomponents, multilayers and host-guest films, whose constituents are metals, semiconductors, oxides, nitrides, dielectrics, organics and polymers. Sonic, or "critical" flow is important to this end. Since the downstream conditions do not affect individual jet operation, the jets are independent, and their effects can be "added". Jet collimation also plays a central role; since the jets do not interfere in the gas phase, a moving substrate can "reactively sum" the deposition fluxes from several to give complex multi-components. It should be emphasized that synthesis in gas jet deposition is accomplished without recourse to toxic precursors, nor are any toxic byproducts generated.

Moreover, the 1 torr pressure range is favorable to microwave and glow discharges which make available atoms, radicals, and ions at high flux for processing of growing films. The pressure regime allows wide latitude for generation of charged species, enabling ion bombardment of the growing film. This energy deposition is a powerful means of controlling film microstructure and crystallinity.

The wirefeed/hot filament jet source has several unique features. Control of the evaporant wire feed rate translates into control of deposition rate. As a consequence of mass conservation, and the high capture efficiency, there is a straightforward proportionality between a vaporized length of wire and the resulting film thickness over a given substrate area. Thermal vaporization of a metal from a small hot zone on a hot filament is efficient. A small "hot zone" can vaporize enough metal to provide a high deposition rate or metal throughput. The vaporization zone in the wirefeed/hot filament is virtually a point source along the jet axis, reducing deposition on the nozzle wall to nearly zero; this augments film deposition efficiency and eliminates down time for cleaning. The rate capability of the wirefeed/hot filament is significant. A 60 watt wirefeed/hot filament source approaches throughputs of 0.1 cc/minute of solid evaporant, the equivalent of a 1 micron film growing over 1000 cm$^2$ every minute.

However, the wirefeed/hot filament JVD source is not usable for all metals. It has proven immensely effective for Au, Cu, Ag, and, with some modifications and constraints, can be used for Al, Sn, In, Zn and Cd. Other metals alloy with and degrade a hot tungsten filament in seconds. Once electrical continuity is broken, the wirefeed/hot filament source can no longer operate. The wirefeed/hot filament technique can be extended to metals such as Al by "sheathing" the filament with a boron nitride cylinder, but the strategy is limited because of poor heat transfer to the vaporizing surface.

Figure 3:
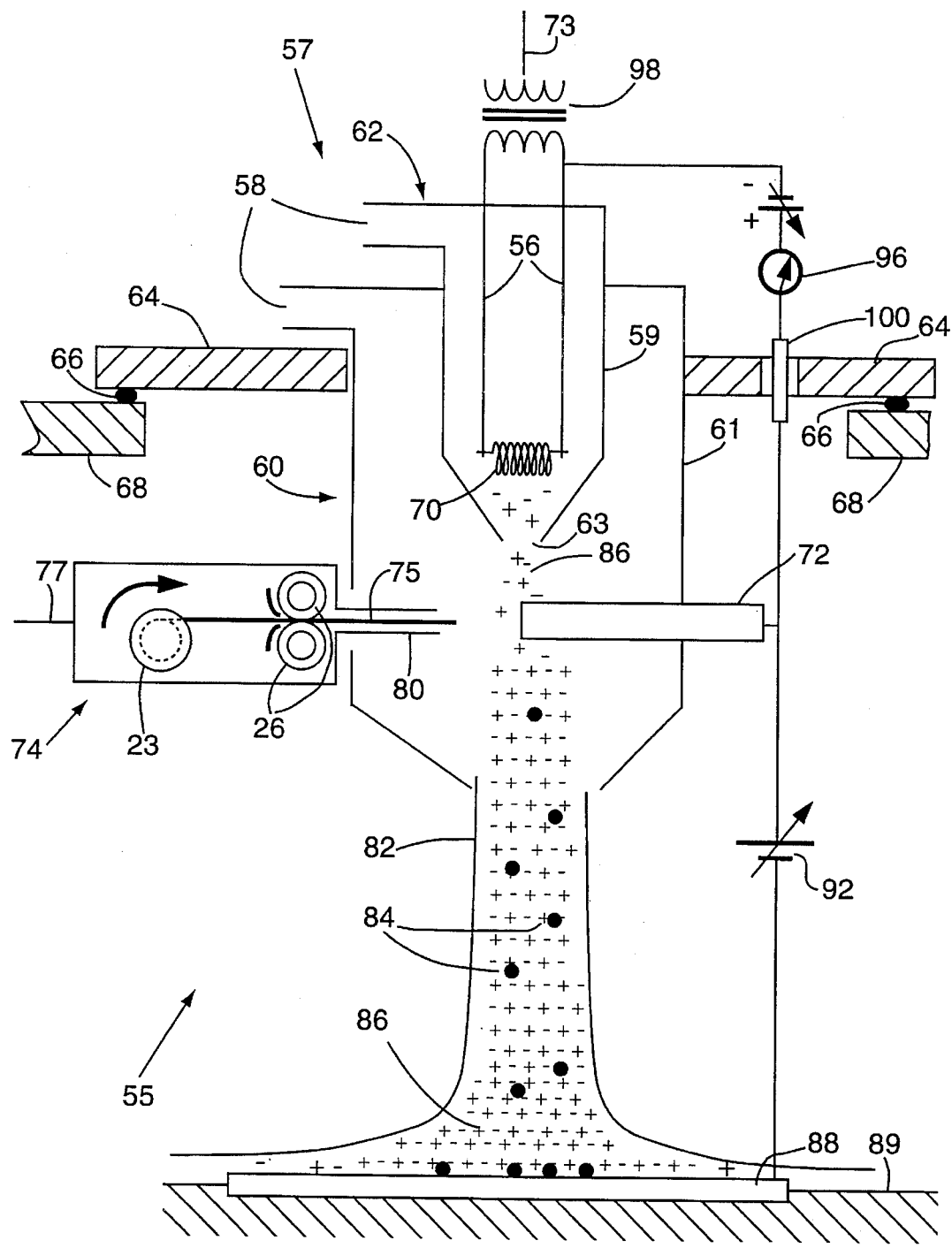
FIG. 3 is a simplified schematic illustration of a portion of an electron jet deposition system provided by the present invention.

FIG. 3 is a simplified schematic illustration of an gas jet vapor deposition system 55 provided in accordance with the present invention and characterized by an electron jet produced by gas jet apparatus 57. The apparatus 57 is affixed to a flange 64, which receives an O-ring 66, and is bolted to a wall 68 of a deposition chamber so that the e-jet apparatus has access to the chamber interior through appropriate openings machined in the chamber wall.

The system 55 includes four main structures. There is a thermionic emission assisted glow discharge assembly 62, which supplies a high current of electrons, and creates an intense plasma 86. Collector "crucible" 72, heated by electrons, serves as a vaporization hot zone. Wire feed mechanism 74 supplies evaporant metal wire to the hot crucible though hypodermic tube 80. The nozzle structure 60 forms main, final jet 82 and convects vaporized metal atoms 84 to a substrate 88 downstream in the chamber. The substrate is located on a mount 89 which can either be stationary or moving such as carosell 40.

Considerable latitude exists in the dimensions of the individual structures as well as the scale of the entire e-jet source, and those given in descriptions to follow are representative, but do not exhaust the possible ranges. There is also latitude in materials of construction: for example, the outer nozzle can be made of metals such as copper and stainless steel, or alternatively, quartz or glass.

The thermionically assisted glow discharge assembly has a tubular or nozzle shaped structure 62, typically 1.2 cm in diameter at exit 64, in which is mounted an electrically heatable tungsten filament 70, shaped as a hairpin or a coil. The filament is about 2.5 cm in length and 0.051 cm in diameter. The filament is held at its ends by screws or spotwelding to heavy insulated feedthroughs 56 that serve as electrical leads.

In its simplest embodiment, the crucible 72 is a tungsten rod 1–2 millimeters in diameter, mounted perpendicular to nozzle axis 73. One end is fixed to an electrical connection; the other lies approximately on the nozzle axis. A sheath (not shown) is sometimes placed on the W rod crucible, partially covering it; this sheath may be $ZrO_2$, $TaB_2$, carbon, or other material, whether conducting or non-conducting. The wirefeed assembly 74 is of similar design to the wirefeed assembly described in the aforementioned U.S. Pat. No. 5,356,673. It directs wire 75 perpendicular to the exposed, free end of the crucible along wire feed axis 77. Thus the crucible axis, nozzle axis, and wire feed direction may be mutually perpendicular. In the wire feed mechanism are a pair of wheels 26, one usually of elastomeric polymer such as Viton, the other of knurled stainless steel, in contact, with the evaporant wire held between them. The steel wheel is turned by a flexible shaft linked to a computer controlled stepper motor (not shown). The wire is guided from spool 24 through the stainless steel hypodermic tube 80 which is aimed at and terminates near the collector crucible.

The nozzle structure 60 comprises inner and outer nozzles 59, 61 and contains within it the thermionic glow discharge assembly and collector crucible. The outer nozzle 63 may be of larger diameter than the thermionic assembly; indeed the two may form a "nozzle within a nozzle" assembly. In simplest form, thermionic filament, and crucible can all placed within a straight cylindrical nozzle of, e.g., 1 cm diameter while maintaining the effectiveness of the apparatus basic operation. In one embodiment, the wirefeed assembly is mounted external to the outer nozzle, except for the hypodermic guide, which passes through a small opening in the nozzle wall.

A system provided in accordance with the present invention can be run at power levels high enough to require water cooling. The preferred material of construction for the nozzle is then copper, through which appropriate channels are drilled to allow passage of cooling water. The nozzle assembly can have a modular construction, in which the thermionic filament and crucible collector are contained in separate modules, which, when bolted together, form a cylindrical nozzle.

The electrical connections for the system are also shown in FIG. 3. A stepdown transformer 98 is used to heat the filament. For the 0.020" W wire described above, the required heating currents lie between 20 and 30 amperes. The filament (and the transformer output) is biased negative with respect to the crucible by a D.C. power supply 94. A D.C. power supply adequate to run the e-jet described here would deliver 40–50 amperes at 100 volts. A substrate bias supply 92 for ion bombardment is also shown in FIG. 3 and can be a D.C. supply for metal films, or an R.F. supply for insulating films. Electrical connection is made to the tungsten crucible via an insulted feed through 100. A current meter 96 also is included in certain applications.

In operation, a flow of carrier gas is established through the e-jet system nozzle assembly via inlets 58. The carrier gas is most commonly Helium, but Argon is successfully used as an alternative. Flow is sustained by a high speed mechanical pump not shown in the Drawing. A typical pumping system consists of a rotary vane pump and Roots blower combination with total pumping speed 4000 to 5000 liters/minute. A pump combination of this size will sustain an approximate 10:1 ratio of upstream (nozzle) pressure $P_u$ to downstream $P_d$ for the outer nozzle diameter given above (0.020"), thus assuring critical flow, and a gas jet exit velocity of the He speed of sound (~$10^5$ cm/sec). The pressure in the vicinity of the thermionic filament 70 is adjusted to be approximately 5–10 torr, and the pressure downstream, near the substrate 86, is then about 1 torr.

The W filament 70 is heated, via the transformer 98, to white heat (T>2000° C.), sufficient to cause thermionic emission of electrons. The filament to crucible voltage is varied between 20 and 50 volts. Typical bias voltages lie between 10 and 50 volts, but the upper limit can be much higher depending upon application.

In operation, thermionically emitted electrons are accelerated through the carrier gas and generate He ions by impact ionization. The resultant electron avalanching and multiplication generates an extremely dense plasma 86, and produces electron currents in the range of 35 amperes at 40 volts. The electron current is collected at the free, high electric field end of the W crucible 102, bringing it to incandescence. A large fraction of the available power is clearly dissipated in the end of the crucible. Since the power can be easily adjusted to greater than 1000 watts, the resultant energy dissipation in the end of the W crucible 102 is sufficient to melt a two mm W rod into a ball, implying a temperature as high as 3500° C. Thus, temperatures are high enough to vaporize nearly any metal in the periodic table at very high rate.

Metal wire is then fed from spool 24 against the crucible's incandescent end and vaporized from it. It is not critical if alloying occurs, or if the rod end deforms. External electrical contact is only necessary at one end of the rod since electrical continuity is sustained by the plasma in contact with the other distal end, independent of the end shape. The present invention thus avoids the central limitation of the wirefeed/hot filament source: the requirement of electrical contact at both ends of the filament.

Alloying damage, so destructive with the wirefeed/host filament systems, is avoided in the present invention. When metal wire from the wirefeed, Ti for example, contacts the hot crucible, a short section melts, wets the crucible, and begins to vaporize from it. At the same time, Ti atoms enter the W lattice, driven inward by the local high Ti concentration gradient at the W surface. Ti solution and Ti vaporization compete. Eventually, all the Ti must escape the W lattice, or else diffuse far enough inward until it reaches a section cool enough to impede any further diffusion. W atoms do not evaporate with appreciable probability at temperatures needed for Ti vaporization. Analysis of deposited Ti films shows no evidence of W incorporation. Ti thus "distills" preferentially from the W/Ti alloy, in much the same way as the most volatile organic components distill first from an organic mixture.

However, Ti solution and exsolution from the W lattice does deform the crucible. The exact contours of the deformation differ for each dissolved metal atom; the effects for Ti are different from Fe. Accordingly it is sometimes useful to protect the W surface with a ceramic sheath such as $ZrO_2$ or $TaB_2$. These ceramics, conductors at sufficiently high temperatures, will collect electrons and heat up just as the W rod, but since they do not dissolve metals, they retain their rigidity when metals contact and are vaporized from them. As Ti atoms vaporize from the crucible, they are caught by the high speed carrier flow, entrained in the jet as it leaves the nozzle and swept downstream to deposit on the substrate. The present system attains extremely high deposition rates, equal to or greater than the rates measured for the wirefeed/hot filament system, approaching 0.1 cc/minute of metal. These rates are characteristic of many applications involving metals such as Ti, Fe, Ni, Cu, and other similar metals.

It is worth noting that localized heating of the crucible could be achieved with an alternative heat source, such as a high power $CO_2$ laser, or a high pressure electron beam. However, neither alternative is as attractive as the preferred plasma heating system. Both laser and electron beam devices are large and costly. The electron beam requires bulky, differential high vacuum pumping stages. Most importantly, neither laser nor electron beam provides the high density plasma of the preferred embodiment. The plasma is the basis of one of the present invention's most valuable properties: high current, low energy ion bombardment.

Ion bombardment modification of film structure, the most striking advantage of the e-jet, is made possible by another aspect of the present invention. The dense plasma created between thermionic filament and crucible is also swept downstream with the jet, and is carried downstream to the surface of the substrate or the growing film. The jet "captures" the plasma efficiently because the mobility of He ions in the plasma is insufficient to enable them to migrate against the flow to the negatively charged W filament. The plasma is electrically neutral over most of its length, and no electric field exists within it. Any applied voltage is dropped near the electrode surfaces, within a small distance known as the "plasma sheath". Normally, the plasma has a natural positive bias with respect to an immersed surface of about 10–15 volts, arising from the higher thermal energies and speeds of electrons compared to positive ions. If no further voltage bias is applied, ions and electrons in equal numbers reach the surface. When the growing film is further biased negatively with respect to the plasma, the ion current increases. The bias voltage appears across the sheath thickness. Ions entering the sheath acquire the bias energy and impact the growing film on the substrate.

The beneficial effects of such ion bombardment on film structure are well established. Ions deliver their energy to metal atoms in the film surface and impart mobility to them. This is equivalent to annealing the surface. Mobile surface atoms seek out and fill vacancies, thereby improving the density and crystallinity of the film. With the present invention, however, ion bombardment is singularly effective because energy in a chosen, optimized range can be delivered more rapidly to atoms in the film than can be done by thermal means. These capabilities arise because for several reasons. The ion density in the e-jet plasma is extremely high and the energy distribution of ions accelerated through the plasma sheath is sharp.

The ion density and ion energy distribution can derived from two measurements. In one measurement, the current-voltage characteristic of a Langmuir probe (a fine Pt wire insulated with a quartz capillary except for the spherical, exposed end) immersed in the e-jet plasma and positioned downstream from the thermionic glow discharge zone is determined at a location where the substrate location. From the shape and limiting current of this characteristic, both the plasma potential and ion density can be derived. For a system as detailed herein, the plasma potential is approximately 15 volts, and the ion density close to $10^{14}$ ions/cc. This is remarkably high when compared to upper limits of $10^{12}$ ions/cc known for typical laboratory glow discharges or microwave discharges. The availability of this ion density already implies that ion bombardment with the present system will be very effective.

In the second measurement, the e-jet plasma impinges on a negatively biased plate containing a probe hole behind which, in high vacuum, was positioned a Faraday cage assembly for retarding potential measurements. Measurement of the current-voltage characteristic indicates the energy needed to stop ions accelerated by the bias voltage in the plasma sheath. The shape of the retarding potential curve yields the ion energy distribution. That is, the fraction of ions having energies between zero and the maximum value, the applied bias voltage. This measurement shows that the energy distribution is very sharp. Most of the ions accelerated in the plasma sheath lose none of their energy in traveling to and through the probe hole.

In addition, the limiting ion currents collected through the probe hole are consistent with the Langmuir probe measurements in indicating a high ion density. By contrast, the energy distribution for a glow discharge jet is typically broad; ions lose much of the bias energy in traversing the sheath, and the number of ions is about one hundred times less than is generated with a system provided according to the present invention. The sharpness of the ion energy distribution with the present system means that every ion in the measured bias current is delivering the set bias energy to the growing film. There is no loss of energy via collisions between He ions and He atoms in the sheath. Energy transfer is thus efficient and predictably simple; every ion in the e-jet bias current delivers the energy dialed in. This is a significant advantage for both basic studies of ion bombardment/structure effects and for systematic process control in manufacturing applications.

The high ion density results from the "high" operating pressure of the present system and the particularly effective plasma generation of the thermionic assisted discharge zone. Similar thermionically assisted discharges have been used, for example, as "plasmatron and duoplasmatron" ion guns for generation of ions in high energy accelerators, and as ion sources for sputtering and ion bombardment in thin film deposition. These devices operate generally at pressures between $10^{-3}$ torr and 0.1 torr, orders of magnitude lower than the pressure range of the present invention. This "high" pressure operation is directly responsible for the high level of electron avalanching and efficient localized high electron current heating of the crucible. The thermionic discharge serves two functions by supplying: 1) high electron current for crucible heating and 2) high density plasma for ion bombardment.

The sharp ion energy distribution is also a consequence of high ion density. This follows from the known relation for plasma sheath thickness d:

$$d = \left(\frac{KT}{ne^2}\right)^{1/2} \quad \text{Equation 1}$$

where T is the absolute temperature, k=Boltzmann's constant, e=the electronic charge, and n=the ion density. For the present system's measured ion density of $10^{14}$ ions/cc, the sheath thickness found from Equation 1 is d~several microns~$10^{-4}$ cm, much smaller than the mean free path l ~$10^{-2}$ cm for atom-ion collisions at 1 torr. The implication is that collisions between accelerated ions and background He in the gas jet are improbable, and that ions will gain the full bias energy and not lose it via collisions on the way to the film surface.

The present invention thus provides a powerful combination of features. Metal vaporization rates are very high, and the available ion bombardment currents are also high. This is a crucial advantage, which may be appreciated by the following example in which metal atom deposition is assumed. A useful criterion for determining ion bombardment effectiveness is that every depositing, neutral metal atom should be struck at least once by an impinging, energetic $He^+$ or $Ar^+$ ion, having energies of several electron volts (e.v.) to several tens of e.v. If this is the case, then every metal atom that deposits will be given enough energy (several e.v.) and therefore mobility, to diffuse rapidly over the growing film surface and find a site of lowest binding energy. Most importantly, this will happen before the next layer of metal atoms deposits. This means that the growing film will have a more perfect crystal structure. There will be no defects left in the topmost layer of metal atoms that can be "sealed in" by the next depositing layer.

Such ion bombardment is far more effective than thermal annealing. For example, if the substrate was heated to a high temperature of 1000° C., the average energy of metal atoms in the film would be only about 0.1 electron volts. The probability of any surface atom having the energy (several e.v.) to diffuse over the surface is small; that is why thermal annealing takes a long time. By contrast, ion bombardment currents provided by the present system are so high that they can "keep pace" with atom deposition rates, and every deposited metal atom in the top layer can be compelled to migrate. If every surface metal atom were given 1 e.v. by ion impacts at this rate, it would be equivalent to heating the film to approximately 10,000° C. A typical deposition flux with the present system would correspond to an equivalent ion flux of about 1 ampere/$cm^2$. This is an enormous value, but it is delivered with ease, largely because of its extremely high plasma ion density. In brief, in order to obtain thorough "ion annealing", the deposition rate of ions should match and keep pace with the deposition rate of atoms. The present system delivers extremely high atom deposition rates; it is remarkable in that it delivers equally high ion deposition rates as well.

Some of the metal atoms vaporized and entrained in the flowing gas may also be ionized by collisions with $He+$ or $Ar+$ ions. Change transfer cross sections for some metal atom inert gas ion collisions are known to be large, on the order of the atom's geometric cross section. Given the prevailing ion densities, metal atom densities, and transit times from nozzle to substrate characteristic of the present system, it is likely that a significant fraction of metal atoms can be converted to ions before they reach the substrate. In that event, these metal ions will be accelerated through the plasma sheath and deposit with the applied bias voltage; their enhanced surface mobility will lead to improved film structure, just as does ion bombardment with inert gas ions.

Some low melting metals, for example, Zn, Ga, and Pb, are inconvenient to vaporize in wire form. As these wires approach the "hot zone", thermal radiation causes melting and a molten ball on the end of the fed wire is formed before contact can be made. The behavior of this ball is unpredictable. For example, it can fall under gravity, or be blown by the jet. This factor can make a wirefeed embodiment unreliable for low melting metals. However, an alternative embodiment of the present invention can be used in these cases as seen in FIG. 4.

Figure 4:
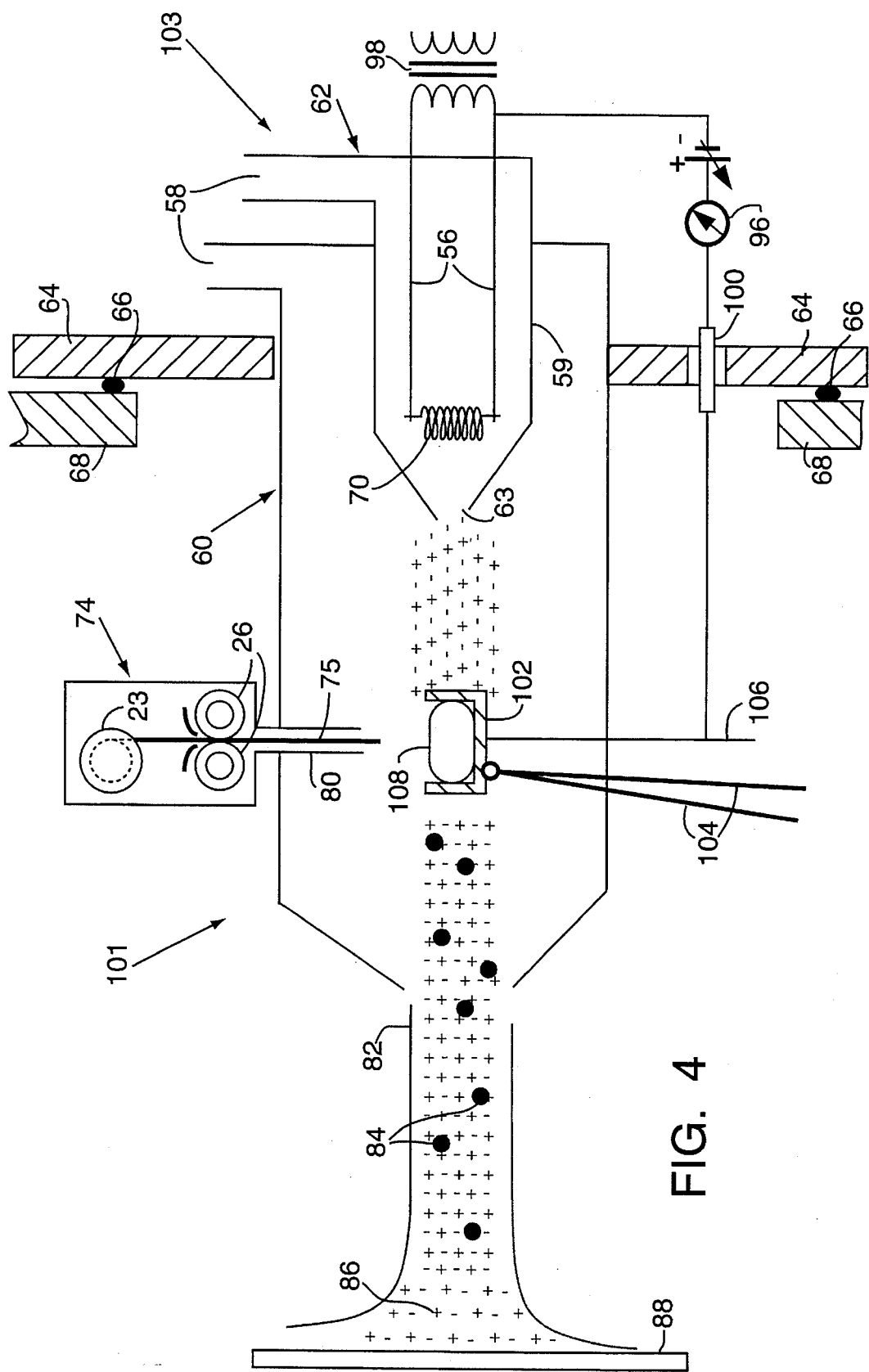
FIG. 4 is a simplified schematic illustration of an alternative embodiment of the present invention modified for vaporization of low melting metals.

Shown in FIG. 4 is a simplified schematic illustration of an alternative embodiment of a gas jet vapor deposition system provided in accordance with the present invention. System 101 is substantially the same as that described above with respect to FIG. 3 and is characterized by an electron jet produced by gas jet apparatus 103. In sum, the apparatus 103 is affixed to a flange 64, which receives an O-ring 66, and is bolted to a wall 68 of a deposition chamber so that the gas jet apparatus has access to the chamber interior through appropriate openings machined in the chamber wall.

The system 101 includes four main structures. There is a thermionic emission assisted glow discharge assembly 62, which supplies a high current of electrons, and creates an intense plasma 86. Collector "crucible" 102, heated by electrons, serves as a vaporization hot zone. Wire feed mechanism 74 supplies evaporant metal wire to the hot crucible though hypodermic tube 80. The nozzle structure 60 forms main, final jet 82 and convects vaporized metal atoms to a substrate 88 downstream in the chamber.

A charge of the low melting metal 108 is loaded into a hollow crucible reservoir 102 of appropriate size, shape and material. The crucible is then heated in the plasma stream, and the metal vaporizes. Heating can be brought about in two ways. If the crucible is electrically conductive, as for example, a metal or graphite, then it serves as a collector for energetic electrons from the thermionically assisted glow discharge. There is an electrical lead 106 to the crucible. The crucible temperature can be measured by means of a thermocouple 104. If the crucible is an insulator, it will be heated by thermal conduction from the hot plasma stream, and by surface catalyzed ion-electron recombination, which liberates significant energy. This strategy can be used to vaporize metals such as Zn, which melts and vaporizes at a low temperature, as well as Sn, which melts at a low temperature but vaporizes at a high temperature. The crucible can be replenished periodically via a wirefeed from above, so that wire melting and ball formation have no ill effects.

Figure 5:
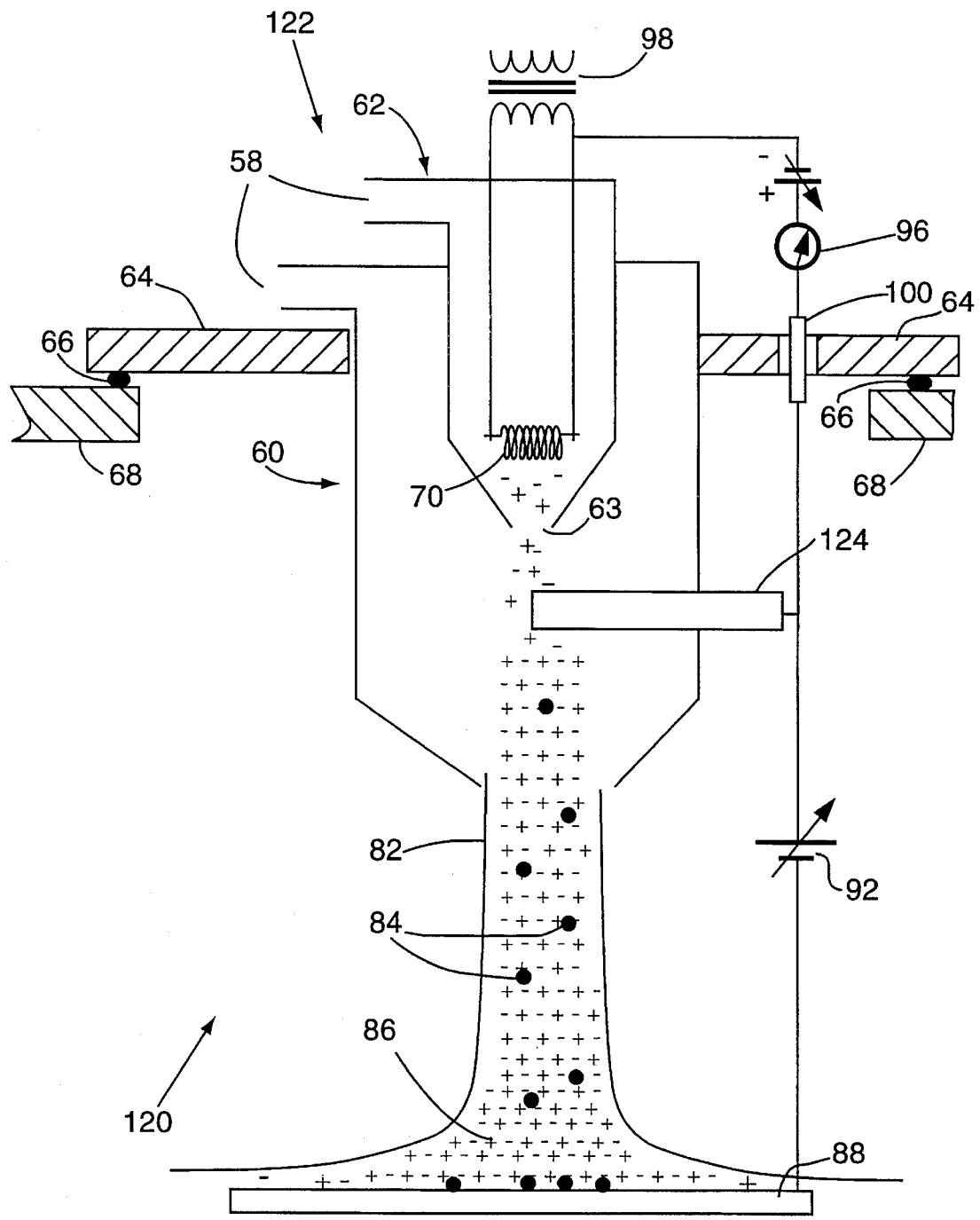
FIG. 5 is a simplified schematic illustration of an alternative embodiment of the present invention showing a carbon rod which serves as vapor source of carbon atoms.

Materials such as carbon can be directly vaporized in the e-jet, as seen in FIG. 5. Shown in FIG. 5 is a simplified schematic illustration of a portion of a second alternative embodiment of a gas jet vapor deposition system provided in accordance with the present invention System 120 is substantially the same as that described above with respect to FIG. 3 and is characterized by an electron jet produced by gas jet apparatus 122. Carbon does not melt, but sublimes directly, and its electrical conductivity is high enough to sink the high electron currents from the thermionic glow discharge jet. The end of carbon rod 124 in FIG. 5, which takes the place of crucible 72 in the system of FIG. 3, becomes hot enough to vaporize at high rate. Steady state operation is obtained by mechanically feeding in the rod 124. It should also be clear to those skilled in the art that a system provided in accordance with the present invention can stand alone as an independent jet source of heat or of ion bombardment in the operating pressure range, apart from being a source of metal atoms at high flux.

A further benefit of the present invention arises from metal atom electronic excitation in the intense plasma carried along with the gas jet. The resulting atomic emission, in the visible and ultraviolet, is extremely strong, and can be easily monitored by standard techniques to provide a measure of the metal atom concentration in the jet, and as a consequence, the rate of metal atom deposition. It has been determined that atomic emission intensity and deposition rate are often proportional. The intensity of radiation in the plasma simplifies the measurement problem.

The present invention's advantage of matched atom and ion deposition rates has been successfully used in several applications. High rate deposition of Ti metal having bulk density and little incorporated oxygen is known to be a difficult challenge. The present invention can be used to deposit a free standing ribbon of Ti as follows: a thin Cu foil can be wound on a carousel can be rotated slowly and oscillated along its axis rapidly in front of a Ti gas jet apparatus. Thereafter, the Cu can be dissolved in ferric chloride, leaving the free standing Ti foil. Ti films have been grown with a substrate biased 0, 10, 20, and 30 volts negative with respect to the plasma so that the Ti film was subjected to high He ion bombardment currents at all times. The following results have been achieved:

High rate deposition: The Ti ribbon was ~30 cm×2.5 cm×40 microns, deposited in less than ½ hour, a very high rate for the electrical power dissipated.

Transmission electron microscopy showed a porous structure at 0 volt bias, decreasing porosity at 10 and 20 volts, and bulk density at 30 volts. This result is remarkable because a 30 volt He ion transfers only a small fraction of its energy to the surface Ti atoms (4 $M_{He}/M_{Ti}$~¼); effective annealing at this low energy is possible because the ion flux is high.

Flexing of the Ti ribbon showed it to be as strong as commercially available rolled foil.

The measured oxygen content was below 2000 ppm, an acceptable value in view of the low purity starting material.

The present system can be used to deposit high quality nickel ferrite thick films, exhibiting the high magnetization and high resistivity essential to microwave performance. Deposition can be at a rate of 6 microns/minute on a 1" square substrate to a total thicknesses of 50–100 microns. This rate exceeds the standard for economic manufacturing by more than a factor of 5, with further rate scaleup possible.

Moreover, the present system appears to be the only process capable of realizing the economies of high throughput manufacturing needed for this type of film.

Those skilled in the art will note that the present invention embodies significant advances in thin film deposition technology. Foremost among these advances are a high rate vapor generation, an intrinsic capability of the wirefeed strategy, but for all metals, rather than a limited few. Moreover, it represents a breakthrough in in-situ microstructure control providing ion bombardment at low energy and high ion flux. In summary, the present invention can accomplish the following:

the deposition of films of any metal;

the vaporization and deposition of metal at the high rates of the wirefeed/hot filament jet source, avoiding alloying, while providing the advantages of the wirefeed strategy;

the production of gas phase ions for high flux ion bombardment of growing films with low energy ions; the ion concentrations are high and the ion energies sharply defined;

the compatibility with large area coating via relative jet-substrate motion;

the compatibility with "multiple jet" moving substrate embodiments; enabling alloy, multilayer, and multicomponent film deposition in combination with similar or dissimilar jet sources and moving substrates;

high throughput manufacture, batch or continuous mode, with in-situ control of properties of the growing film.

Although the foregoing description of the electron jet contains numerous specifications, these should not be construed as limiting the scope of the invention but merely as providing illustrations of some of the presently preferred embodiments of this invention. For example, the nozzles can have other shapes, the pressure ranges and operating voltages can be extended outside the ranges given as examples. The construction of the thermionic filament assembly can be accomplished in other forms, other carrier gases can be used, the crucible can be of various shapes and materials, etc. The source of electrons need not be thermionic. These capabilities are achieved in a device that has low capital cost, efficient power usage, and poses no environmental threat. A gas jet apparatus provided in accordance with the present invention is compact and its operation requires only an inexpensive power supply and a small footprint mechanically pumped flow system. Vaporization of metals using the present system poses no known environmental threat.

Similarly, although the invention has been shown and described with respect to a preferred embodiment thereof, it should be understood by those skilled in the art that various other changes, omissions and additions thereto may be made therein without departing from the spirit and scope of the present invention.

I claim:

1. A gas jet system for vapor deposition of material upon a substrate, said system comprising:

a vacuum chamber having a port allowing for access to a vacuum chamber interior;

a means for positioning the substrate within said vacuum chamber interior at a substrate position;

a gas jet apparatus affixed to said vacuum chamber port for depositing the material on said substrate by providing controlled entry of the material into the interior of the vacuum chamber, said gas jet apparatus including:

a nozzle having an interior cavity for providing, from a nozzle tip, a supersonic jet of gas formed from a neutral plasma directed towards said substrate position;

a means for providing the material within said nozzle interior cavity;

a cathode means for providing electrons to said nozzle interior cavity;

an electrical potential means for providing an electrical potential between said cathode and an anode causing said anode to become heated such that when said material is presented to said heated anode, said material is vaporized and substantially all of said vaporized material is directly entrained within said supersonic jet of gas and presented to said substrate; and a pump means for evacuating gas from said vacuum chamber to maintain a pressure in said vacuum chamber.

2. The system of claim 1 further comprising a means for moving said substrate from said substrate position to a substrate second position;

a second gas jet apparatus affixed to a second vacuum chamber port for depositing a second of the film on said substrate by providing controlled entry of a reactant gas into the interior of the vacuum chamber, said second gas jet apparatus including:

a second nozzle having an interior cavity for providing, from a second nozzle tip, a supersonic jet of gas directly towards a substrate second position;

a means for providing carrier gas within said second nozzle interior cavity; and a means for providing the reactant gas within said second nozzle interior cavity.

3. The system of claim 1 further comprising:

a means for moving said substrate from said substrate position to a substrate subsequent position;

a ion bombardment gas jet apparatus affixed to a second vacuum chamber port for providing ions to said substrate said second gas jet apparatus including:

a ion nozzle having an interior cavity for providing, from a ion nozzle tip, a supersonic jet of gas directly towards a substrate subsequent position;

a means for providing carrier gas within said ion nozzle interior cavity;

a ion bombardment cathode means for providing electrons to said second nozzle interior cavity; and an electrical potential means for providing an electrical potential between said ion bombardment cathode means and an ion bombardment anode.

4. The system of claim 1 wherein said cathode means further comprises a means for thermionically generating electrons.

5. The system of claim 1 wherein said anode comprises a tungsten crucible.

6. The system of claim 1 wherein said means for providing material further comprises a wire feed mechanism.

7. The system of claim 1 wherein said means for providing material further comprises a crucible having an interior chamber.

8. The system of claim 1 wherein said substrate positioning means further comprises a carousel sequentially positioning one or more substrates at a plurality of substrate positions.

9. The system of claim 1 wherein said anode is provided within said nozzle interior cavity.

10. The system of claim 1 further comprising:

a second nozzle having a second nozzle interior cavity and nozzle tip, said second nozzle being encompassed by said gas jet nozzle;

said cathode means being disposed within said second nozzle interior cavity;

a means for providing gas within said second nozzle interior cavity; and said anode being provided within said gas jet nozzle interior cavity.

* * * * *